(12) United States Patent
Checcucci

(10) Patent No.: US 8,011,922 B2
(45) Date of Patent: Sep. 6, 2011

(54) APPARATUS FOR DECORATING OBJECTS BY SUBLIMATION

(75) Inventor: Paolo Checcucci, San Donato Milanese (IT)

(73) Assignee: Decoral System USA Corp., Coral Springs, FL (US)

( * ) Notice: Subject to any disclaimer, the term of this patent is extended or adjusted under 35 U.S.C. 154(b) by 981 days.

(21) Appl. No.: 11/882,093

(22) Filed: Jul. 30, 2007

(65) Prior Publication Data

US 2009/0031956 A1 Feb. 5, 2009

(51) Int. Cl.
*F27B 9/04* (2006.01)
(52) U.S. Cl. .................. 432/144; 432/152; 156/380.9
(58) Field of Classification Search .................. 432/120, 432/144, 152, 206; 156/380.9, 382, 359
See application file for complete search history.

(56) References Cited

U.S. PATENT DOCUMENTS

| | | | | |
|---|---|---|---|---|
| 4,662,966 A * | 5/1987 | Sumi et al. | ..................... | 156/230 |
| 5,893,964 A * | 4/1999 | Claveau | ........................ | 156/382 |
| 6,221,189 B1 * | 4/2001 | Kieras et al. | .................... | 156/64 |
| 7,302,981 B2 * | 12/2007 | Benetton | ........................ | 156/359 |
| 2007/0240812 A1* | 10/2007 | Bortolato | ....................... | 156/230 |
| 2009/0165959 A1* | 7/2009 | Checcucci et al. | ......... | 156/380.9 |
| 2009/0320748 A1* | 12/2009 | Fenzi | ............................... | 118/58 |
| 2010/0054718 A1* | 3/2010 | Giacomello | ................. | 392/411 |

FOREIGN PATENT DOCUMENTS

IT  MI2005A000134  1/2005

* cited by examiner

*Primary Examiner* — Gregory A Wilson
(74) *Attorney, Agent, or Firm* — Nixon & Vanderhye P.C.

(57) ABSTRACT

Apparatus and a process for the continuous cycle decoration of profiled bars for shutters and frames, or other similar objects, with a carrier film of plastic material, printed with the desired decoration with sublimable inks. The process provides for a significant number of profiled bars or decorated steel sheets to be produced per unit of time.

25 Claims, 6 Drawing Sheets

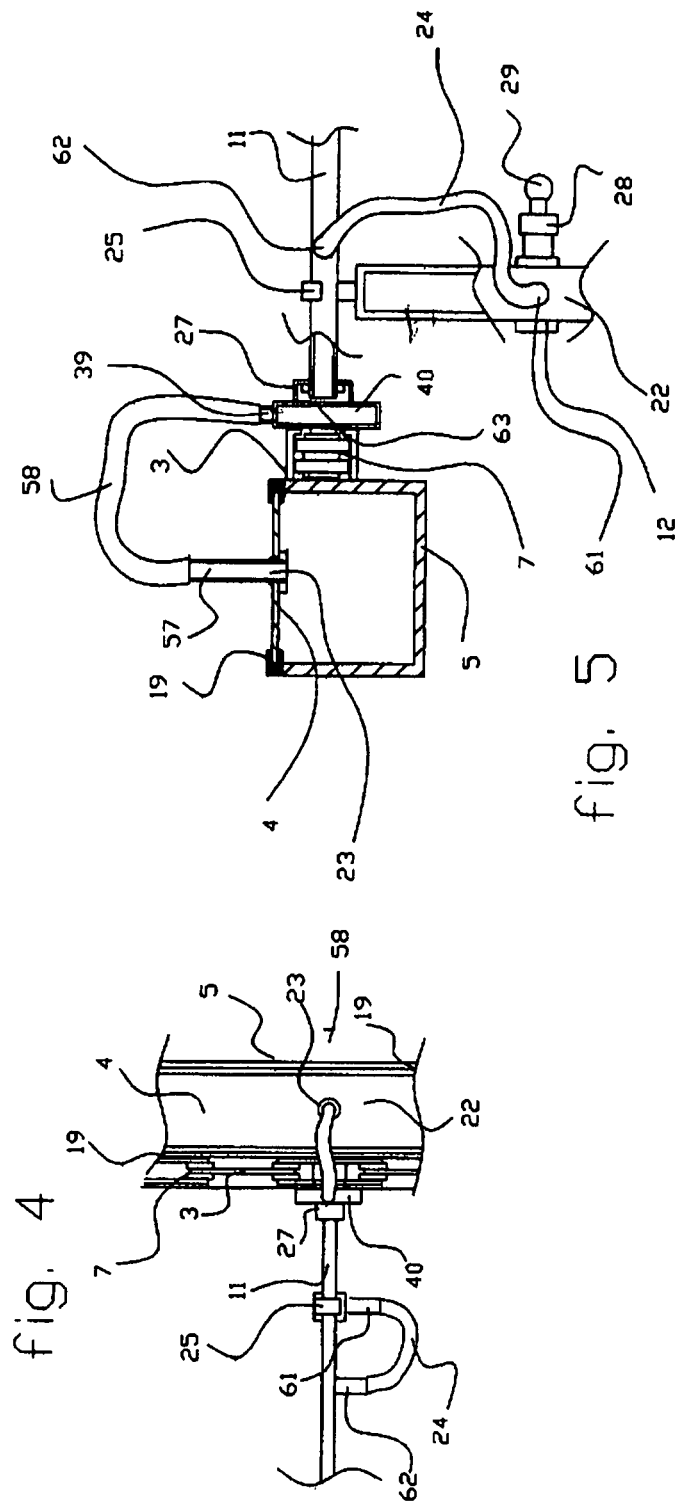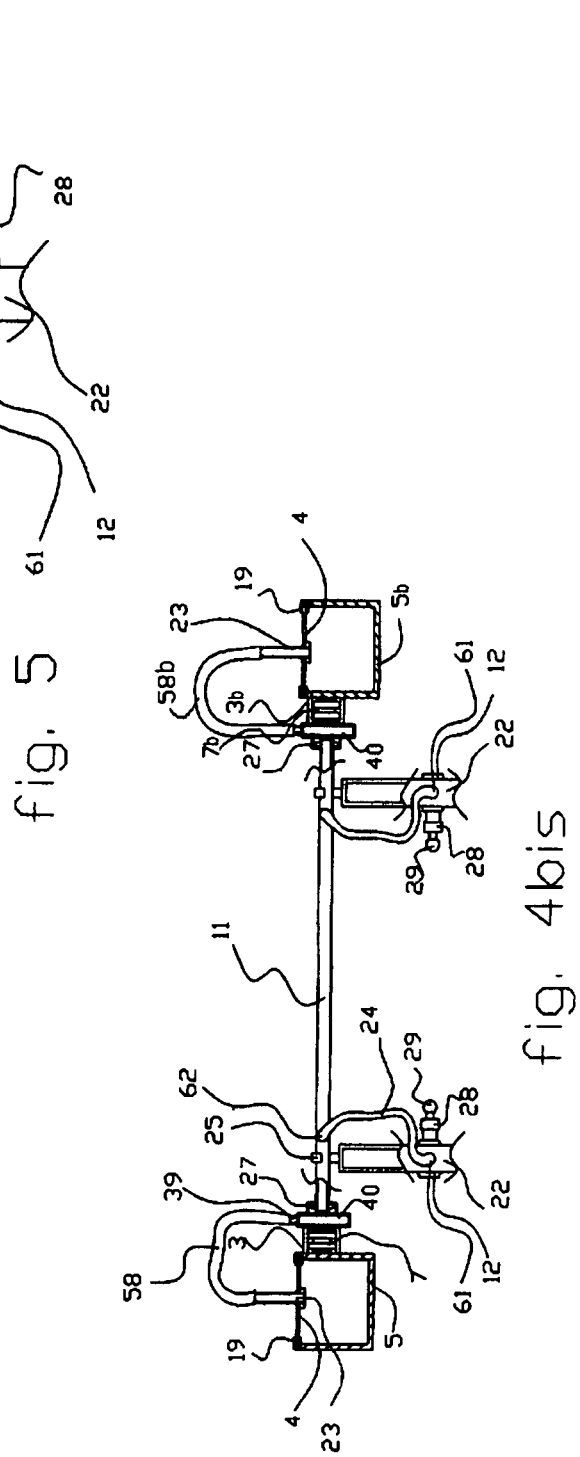

fig. 9 fig. 7 fig. 6 fig. 6bis

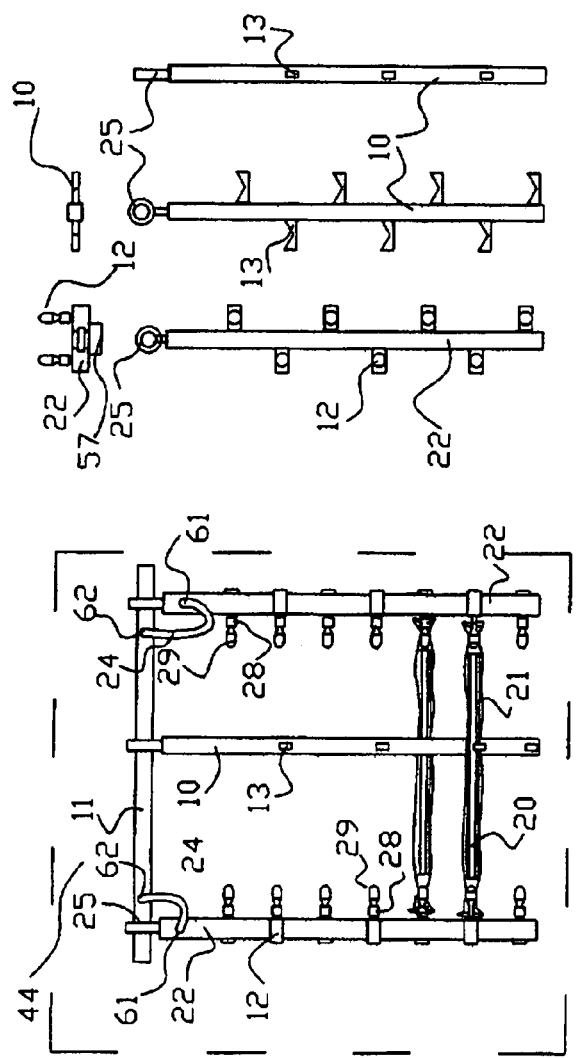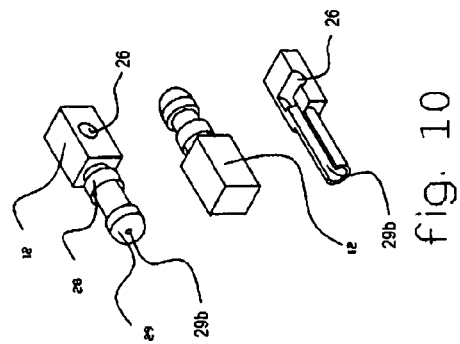

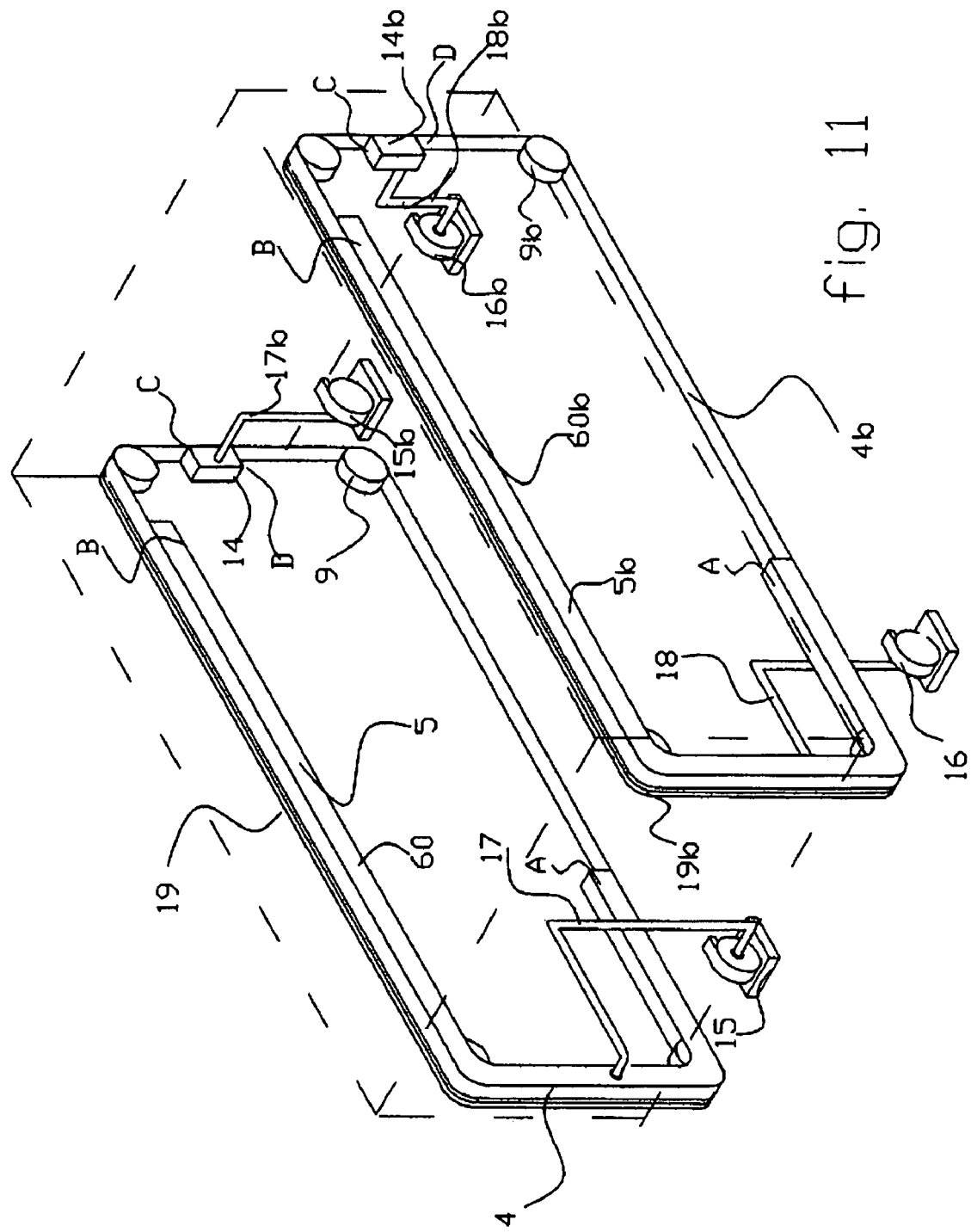

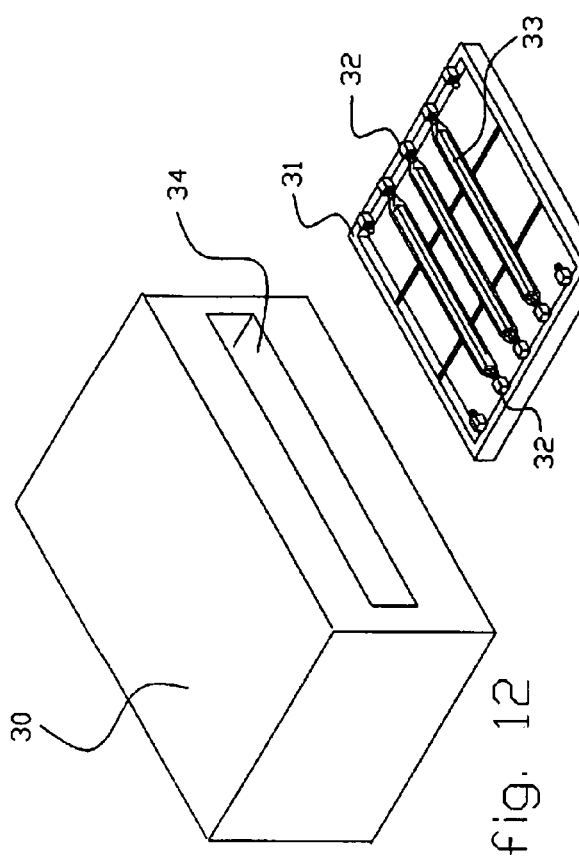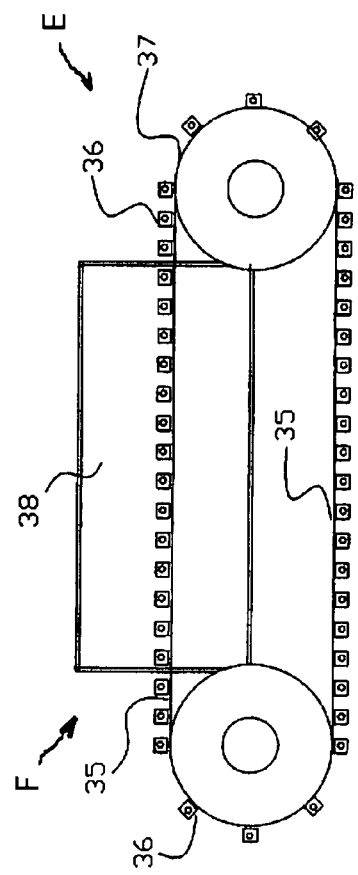
fig. 12
fig. 13
fig. 14

APPARATUS FOR DECORATING OBJECTS BY SUBLIMATION

The invention relates to an apparatus for the decoration, by sublimation, of objects, in particular profiled bars for shutters and frames or steel sheets.

The invention also relates to a method for decorating objects by sublimation that enables the costs to be reduced of both production and energy, a remarkable number of decorated objects, for example profiled bars or decorated steel sheets, being suitable for being produced in the unit of time.

BACKGROUND OF THE INVENTION

In order to describe more simply the apparatus, reference will be made to the decoration of profiled bars. As it is known, the decoration of metallic profiled bars, in particular for shutters and frames, previously painted with polymeric paint, is obtained by sublimation of colored inks having the property of subliming at a prefixes temperature and previously printed on a plastic or paper support, in order to form the desired decoration.

The decoration is transferred from the printed support to the substrate that is desired to be decorated by sublimation. Sublimation is a transition of a substance from the solid phase to the vapor phase, without passing through the liquid phase, by providing the substance with energy under the form of heat up to the temperature needed for such a process to take place.

Usually, the support, from which the decoration is transferred to the object to be decorated, is a film of plastic material, impermeable to air and capable of withstanding high temperatures, of about 250° C., without spoiling. Several systems are known that enable the sublimable decoration to be applied, which systems however can not disregard three phases of the decoration by sublimation:

1) placing into contact all the surfaces of the object that is desired to be decorated with the decorating film.

2) maintaining the decorating film adherent to the surfaces of the object, otherwise the vapor pressure of the sublimable inks would detach the decorating film from the surfaces of the object resulting in a transferred decoration of uncertain reading and definition.

3) heating the object wrapped in the decorating film, for example in a kiln, for raising the temperature of the decorating film wrapped about the object to be decorated to the temperature at which the inks sublime.

The known systems used for decorating the metallic profiled bars generally comprises two distinct apparatuses.

A first apparatus performs the construction of a wrapping, (generally tubular, the profiled bar being from six to seven meters long), formed with the decorating film wound around the profiled bar. The first apparatuses, with which the envelope or the wrapping of the profiled bar is formed, are so called wrapping machines, linear, tunnel, etc., normally used also in other production fields.

A second apparatus performs the sublimation of the decoration from the decorating film to the object.

An object of the invention is to improve the known apparatuses.

Another object is to resolve the problems arising in the phase 3) cited above that, in the light of the actual state of the art, constitutes an actual bottleneck for the purposes of increasing the production and the possible reduction of the costs.

A further object of the invention is providing a particular passing through kiln that enables to increase the daily productivity of decorated profiled bars, with respect to the systems currently known, passing from a number of 120-150 profiled bars per hour to more than 400.

Another object of the invention is that of providing a method for decorating objects by sublimation carried out by the apparatus.

FIG. 12 shows a first typology of kiln 30, presently known, which is supplied, usually, by means of one or more carriages comprising a frame 31, FIG. 13, whereon the profiled bars 33 are placed already wrapped into the film and separated from each other, at a prefixed pitch. Such carriages may support a number of profiled bars according to the number of openings 32, known, for sucking air, arranged in parallel rows at opposite ends of such carriages. The two open ends of the tubular enclosure made with the decorating film, inside which a profiled bar is longitudinally wrapped, are connected with suction ports 32, which are connected with a suction device such as a vacuum pump or a fan, not shown in figure.

Once the air between the film and the profiled bar has been sucked, the external atmospheric pressure causes the film to tightly adhere to the profiled bar, as required by the necessary cited condition 2). While the suction device is kept in function, the carriages are then introduced through the inlet 34 in the kiln 30 in order to reach the temperature necessary to cause the inks of the film to sublime and, thus, to transfer the decoration in the substrate of the surface of the profiled bars, previously painted, as known, with polymeric powders.

Once the sublimation of the inks has occurred the carriage 31 is extracted from the kiln in order for the profiled bars to be unloaded by the operators, and another, previously prepared carriage is introduced, giving rise to a new decoration cycle.

Another type of kiln 38, FIG. 14, called a passing through kiln, enables the profiled bars to be loaded step by step on closed loop chains 35 that form a supporting plane, said closed loop chains being driven by gear wheel 37. The upper portion of the chains 35 pass longitudinally through the kiln 38. The profiled bars, wrapped in the film, are laid on supports positioned on the plane formed by the conveyor chains 35 in the region E, being the ends of the film connected with suction ports 36, in order to create a degree of vacuum between the film and the profiled bar. Passing through the kiln from E to the exit F, the profiled bars are heated up to the sublimation temperature, whereby at the exit F of the kiln said profiled bars appear decorated and are unloaded by other operators.

From all that described above, it can be inferred that these technologies do not have the necessary industrial capability suitable for a reduction of the production costs, since their usage, due to the low productivity, requires the employment of manpower for at least three working turns per day in order to be economically convenient.

An object of the present invention is, then, to obviate the cited disadvantages of the state of the art, with a process and an apparatus that enable the restraints of the production cycle to be removed, the working turns to be reduced by combining the productivity of the three turns in only one turn, reducing, thus, both the costs of the manpower and the overall costs of the production.

An object of the present invention is an apparatus and a process for the continuous cycle decoration of profiled bars for shutters and frames, or other similar objects, by means of a film of plastic material, printed with the desired decoration with sublimable inks, that enable the disadvantages of the heretofore known technology to be removed.

As known in the present technology, after the profiled bar to be decorated has been prepared wrapped in the film and the other cited operations, said profiled bar has to be arranged on a carriage where more sucking stations exist, one for every profiled bar, comprising sucking ports for sucking air from inside the enclosure wrapped around the profiled bar. Such sucking ports are manually introduced by two operators, one operator for every end portion of the profiled bar, into the open ends of the enclosure, in order to cause the film of the enclosure to adhere to the profiled bar by means of suction of air from inside the enclosure until a degree of vacuum is reached. The sucking force is so as to oppose the force that will be developed due to the vapor pressure of the subliming inks, so that said film does not detach from the surface, preventing thus the decorative drawing from being diffused internally of the layer of the previously applied polymeric paint. Such suction is to be maintained also within the sublimation kiln in order to continuously suck the possible excess of vapors that could form. The time necessary for bringing the profiled bar to the sublimation temperature depends on the power of the kiln, the external surface of the profiled bar and its mass.

In these conditions the times for completing the sublimation are on average of the order of five, six minutes depending on the number of profiled bars to be decorated that has been introduced in the kiln, normally ten, twelve profiled bars. Since the profiled bars are six, seven meters long, working in an kiln of the type 38, FIG. 14 by loading a profiled bar at a time, sublimation times would be similar to the times described above since the kiln advancing speed is to be adjusted so as to follow the speeds of the loading operations, so as to obtain at most three, four decorated profiled bars per minute. The same production rate obtained also with carriage kilns.

Even increasing the number of the pre-wrapped profiled bars available, that is the number of the working wrapping machines for wrapping the decoration film around the profiled bars, or the number of personnel in charge, the described kilns are not capable of increasing their productivity due to the drawbacks imposed by their structure. It is apparent that in order to increase the productivity of such type of systems, the number of the kilns is necessary to be doubled or triplicated.

In these processes, a production of 100-120 decorated profiled bars per hour is considered acceptable.

The process and the apparatus of the invention can exceed these production rates, furthermore combining, the present daily production, accomplished in three working turns, in a single turn.

It is apparent that the apparatus of the invention has to be supplied by pre-wrapped profiled bars in a number sufficient for maintaining its very high productivity.

BRIEF DESCRIPTION OF THE DRAWINGS

The objects and the relative advantages of the apparatus of the invention will be highlighted by means of the following disclosure, with the aid of the following figures, intended only as schematic and non-restrictive representations:

FIGS. 4, 4bis and 5, are views of details of the apparatus of FIG. 1, showing coupling members with a conveyor device for introducing the profiled bars into the kiln, and connections for the vacuum pressure;

FIG. 6 is a perspective view of a channel for the vacuum pressure and a belt or tape that closes said channel;

FIG. 6bis is a schematic view of connecting element for connecting the channel to an air path obtained in a frame of a supporting arrangement for supporting the objects to be decorated;

FIG. 7 is an axonometric views of the connections of the tape with the chain of the conveyor and of the connections with a bar of a vacuum pressure device;

FIG. 8 is a view of bars, of an intermediate supporting member for the profiled bars and the suction ports placed on the bars;

FIG. 9 is an exploded view of details of FIG. 7;

FIG. 10 is a view of suction ports provided in the apparatus of FIG. 1;

FIG. 11 is a view of the full path covered by the conveyor, comprising a suction tunnel and a cooling tunnel.

FIGS. 12 and 13 and 14 are schematic views of the known technologies of the subliming kilns.

DESCRIPTION OF THE INVENTION

Figure 1:
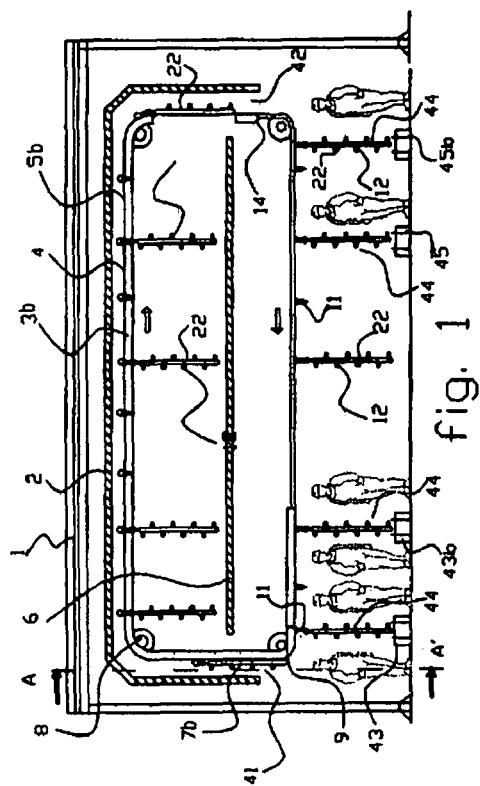
FIGS. 1 and 2 are respectively an elevation and a top view of an apparatus for decorating objects by sublimation.

An apparatus for decorating objects by sublimation comprises:

A first closed loop track 3, FIG. 1, FIG. 11, positioned on a vertical plane with respect to a plane parallel to the ground, properly spaced apart from said plane parallel to the ground, provided with a chain conveyor 7 sliding along the perimeter of said track 3.

A second closed loop track 3b parallel and with a perimeter homologous with said first track 3, spaced apart from said first track 3 and provided, like the first track 3, with a second chain conveyor 7b sliding along the perimeter thereof with speed synchronized and equal to the speed of said first conveyor, FIG. 11.

The perimeter of said closed loop tracks 3, 3b may have a substantially parallelepiped shape.

Figure 2:
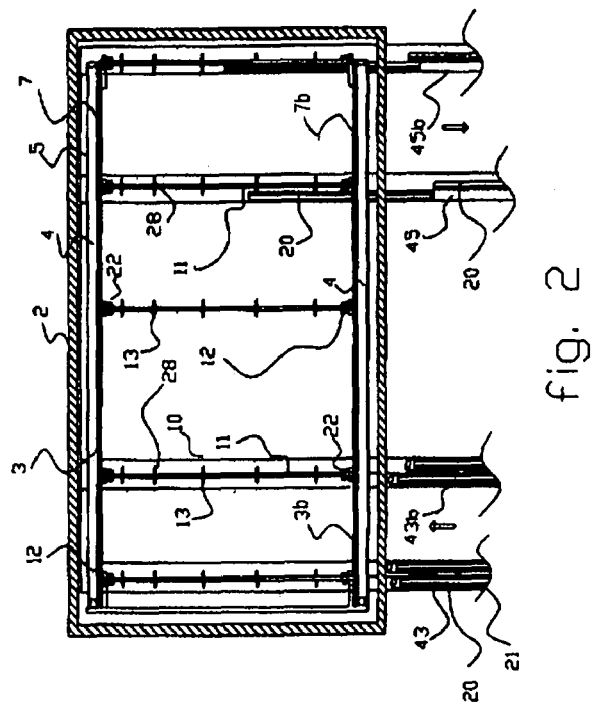

A selected number of elongated elements or bars 11 or, as called in the technical sector, cradle, FIG. 1, FIG. 2, FIG. 8, coupled, at one end thereof, with a rotating joint 27 connected, in FIG. 4 in top view, in FIG. 5 in partial section, with the chain conveyors 7 and 7b by means of a plate 40 connected with the chain in a fixed position. The rotating joint 27 enables a supporting element 22 and an intermediate support 10 of the profiled bars, hanging from said bar 11, by means of hooks 25, to be perpendicular to the ground along the loop path of the conveyors.

Said bars 11 mounted on the tracks 3, 3b of the conveyors 7, 7b and coupled with the sliding chains are uniformly spaced apart from one another. The number of the bars 11 is variable according to the length selected for the path of the closed loop conveyors 7, 7b.

The supporting elements 22 comprise rods or hollow bars, or columns, sealed in an upper part and in a lower part thereof, having an upper ring hook 25, or a ring of other type, that can be opened and is suitable for being hanged from said bars 11, FIG. 4, 5 and FIG. 8. Said supporting element 22 is suitable for being connected with a sucking device by means of a sleeve 61, suitable for receiving a rubber hose, through a tube 24.

The supporting elements 22 are coupled on two rows and comprise suction ports 12, known, mounted alternatively on two selected parallel faces of the supporting element 22. In other words, two consecutive suction ports 12 along the supporting element 22 protrude from opposite sides of the supporting element 22. Heads 29 are introduced into open ends of an enclosure obtained by wrapping a transferring sheet around a profiled bar, said transferring sheet having a decorative drawing made of sublimable inks. The open end of the enclosure are blocked on the head 29 by a ferrule 28, that is advanced on the head 29 until the enclosure is tightened between the ferrule 28 and the head 29. Said suction ports 12, FIG. 10, are suitable for producing a vacuum pressure, i.e. a degree of vacuum, inside the enclosure made from the transferring sheet wrapped around the profiled bar.

Said supporting elements 22 are positioned one at each end of the bar 11, so that a pair of supporting elements 22 are provided for each bar 11. During movement along the track of the conveyor, the bar 11 engaged in the rotating support 27 rotates keeping the supporting elements 22 perpendicular with respect to the ground.

Intermediate rods or supports 10 have pods or supporting members 13, mounted alternatively along the intermediate support 10, being corresponding as regards the vertical position, to the suction ports 12 of the supporting element 22. In other words, the supporting members are staggered along the intermediate support, so that two consecutive supporting members 13 protrude from opposite sides of the intermediate support 10. Said supporting members 13 are used for supporting the profiled bars, in particular during the loading of said profiled bars on the apparatus.

Figure 3:
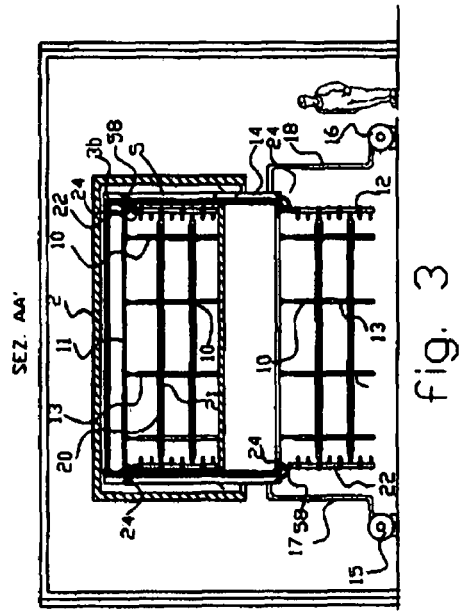
FIG. 3 is a side sectional view of the apparatus of FIG. 1.

The intermediate supports 10 are suitable for being installed in intermediate positions on the bar 11 by means of the openable round hook 25 or a hook of another type, as in FIG. 3, FIG. 8, suitable for being freely positioned along the bar 11. Said intermediate supports 10 remain perpendicular with respect to the ground at any point of the path of the conveyor.

Two boxes 5 and 5b have the shape of a U, and both have the same perimetric shape of the path of the two conveyors 3, 3b. On the open portion thereof a pair of guides 19, for example made of Polytetrafluoroethylene (PTFE), are inserted so that a tape 4, 4b, for example a metallic closed loop tape, can slide between said pair of guides 19, as long as said tapes 4, 4b follow the path of the conveyors 3 and 3b, as can be seen for example in the FIG. 6, FIG. 7, FIG. 11, so as to form in this manner an airtight channel 60 or 60b.

Figures 6, 7, 9:
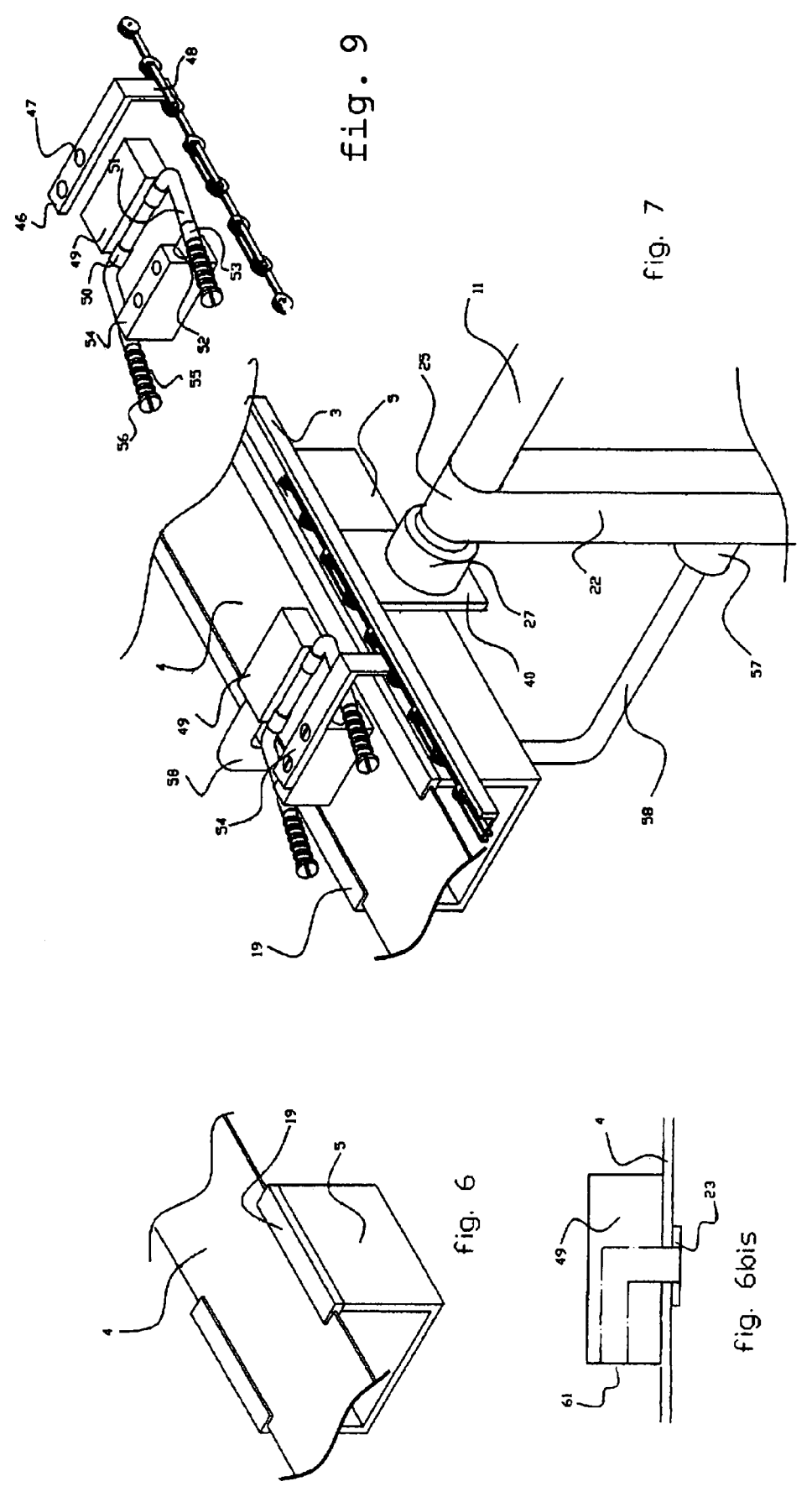

A driving arrangement for said tapes 4, 4b, FIG. 6, 7, comprises a rigid L-shaped bar 46, anchored to the chain at a point 48, having holes 47 for fixing screws with a parallelepiped block 54, said parallelepiped block 54 being positioned so as to be in a higher position with respect to the plane of the sliding tape 4. Said block 54 comprises a longitudinal channel, inside which an U-shaped rotating pin 52 is housed, at the ends of which two cylindrical bushes 53 are positioned, FIG. 9; at the interior of said bushes 53, a U-shaped pin 51 is passing, at the two free ends of which, a spring 55 is inserted, which spring 55 can be placed more or less in tension by means of the rotation of a screw 56, reducing or increasing the length of said springs 55 against the bushes 53; a further parallelepiped block 49 firmly connected with the tape 4, carrying, as shown in FIG. 9, two further bushes 50 inside which the flat portion of the pin 51 is housed and in which said pin 51 can freely rotate, FIG. 7, 9. Such driving arrangement easily enables, by means of the compression of the springs 55, to compensate possible lengthening of the chain or of the tape due to their heating at the temperature of the kiln.

A heating kiln 2 for sublimation, positioned in the upper portion of said conveyor and comprising on the inside thereof the upper portion of the loop tracks 3, 3b, FIG. 1, so that said upper portion has a height that enables the vertical passage of the complete suspended frame 44, FIG. 8. Said kiln 2 is provided at one end with an entrance opening 41 for said suspended frames 44, equipped with the supporting elements 22 and the intermediate supports 10 disclosed above, as in FIG. 6, FIG. 8, which suspended frames are driven by the chain conveyors along the perimetric path of said tracks and with at least one exit opening 42, from inside the kiln 2, for said suspended frames, at the opposed end of the path. The kiln can be heated by means of circulation of hot air, or by means of any other suitable devices such as for example infrared panels.

The arrangement of the kiln involves a number of advantages, the kiln being disposed over the loading region of the profiled bars, as defined by the containers 43, 43b, where the profiled bars are loaded on the suspended frames. When the conveyors are in movement, the suspended frames with the profiled bars, hanging therefrom, go into the kiln through the entrance opening 41, remaining perpendicular with respect to the ground, following a path from bottom to the top and exit therefrom from top towards the bottom through the exit opening 42.

In this configuration the entrance and exit openings are arranged in horizontal position so as to give place to the configuration of a bell kiln with the known advantages as regards both exiting of the hot gas, and the uniformity of heating in order to obtain an optimal transfer of decoration by sublimation, taking advantage, furthermore, of the economical benefits due to its known low heat dispersion. The operation of the apparatus is step by step, occurring through the following steps:

At the start of the apparatus, the intake fans 15 and 16 connected by means of the tubes 17 and 18 with the channel 60, 60b, formed by the boxes 5, 5b and the tape 4, 4b, sliding in airtight manner, closed at the longitudinal ends by the guides 19, 19b FIG. 11, produce a vacuum pressure, i.e. a desired degree of vacuum, along said channels from the beginning A to the end B. In the FIG. 1 it is apparent that the path of said channel passes inside the kiln 2 so as to maintain, as required, the vacuum pressure and the suction effect during the heating of the transferring sheet in order to obtain the transfer of the pattern by sublimation.

Considering only one side of the path of the loop track 3, being the other side completely equal, the vacuum pressure produced by the suction of the fan will be distributed over the full path of the channel 60, from A to B, FIG. 11, being transmitted through the hose fitting 23 (FIG. 4), positioned on the tape 4 and connected with channel 60, through the tube 58 (FIG. 5), the further hose fitting 39, positioned over the hollow plate 40, and through internal openings 63, up to the air tight rotating joint 27, FIG. 4, 5, 5bis. The bar 11, engaged with the rotating joint 27 that is subjected to a vacuum pressure, will be subject in turn to a drawing power that, through the connecting element 62, the tube 24, the sleeve 61 positioned on the hollow supporting element 22, is transmitted to the suction port 12 connected to said supporting element 22 by means of the hole 26, FIG. 10. Consequently air is drawn through a hole 29b on the head 29 of the suction port 12, with a flow rate depending on the fan 15, having a motor whose rotation speed is adjustable by means of an inverter (known electronic regulating device). The same identical configuration is applied to the other conveyor and to the channel 60b by means of the fan 16, FIG. 11.

In a prefixed loading region, the profiled bars, previously enclosed in the decorating transferring sheet by means of a machine of known technology, are transported in said prefixed loading region inside suitable containers 43 and 43b, or with other devices such as a sliding belt conveyor, shown in FIG. 2, carrying the enclosed profiled bars and moving in the direction represented by the arrow. The profiled bars are picked up alternatively by two pair of operators, arranged at the ends of the complete suspended frame 44, in order to be loaded on said suspended frame 44, resting on the alternating supporting members 13 of the intermediate support 10. The sucking heads 29 of the suction port 12 are introduced into the open ends of the transferring sheet 21, having the shape of a tubular enclosure, inside which there is the profiled bar 20, and the transferring sheet 21 is airtight fixed, with the forward movement of the ferrule 28 up to contrast the head 29, by means of the two operators, which are positioned one at every end of the transferring sheet enclosing the profiled bar. Once the ends of the enclosure made from the transferring sheet have been tight sealed, as disclosed above, the suction effect of the suction port 12 causes the decorating enclosure to adhere to the profiled bar by means of the pressure difference resulting with respect to the atmospheric pressure.

A third operator, manually, sliding its hands on the enclosure made from the transferring sheet, will adjust said transferring sheet so that folds or wrinkles are avoided. Fold and wrinkles could cause defect of the decoration on the profiled bar after the sublimation, which profiled bar, from both qualitative and aesthetical point of view, would not be accepted and thus, waste profiled bars would be produced.

It is to be noticed that the suction port 12 firmly connected with the supporting element 22, as shown in FIG. 8, is arranged in alternating manner with respect to the first side of said supporting element 22. See FIG. 1, FIG. 6 and FIG. 8. The alternating arrangement of the profiled bars enables, with great advantages for the purposes of the production, the capability of simultaneous work of the double pair of operators employed in loading the profiled bars, that is a pair of operators at every side of the suspended frame.

Furthermore, once the suspended frame has been introduced into the kiln, the alternating arrangement enables the hot air to be better and more rapidly diffused and exchanged around the profiled bars due to the greater turbulence so created, reducing the time needed for reaching the temperature of sublimation. The same process is carried out by another double pair of operators that couple the profiled bars, as said, on the second suspended frame, at the station 44b, being understood that a further pair of operators will attend to the distension of the transferring sheet over the profiled bar.

Once the two suspended frames have been loaded, the track conveyor will be advanced by one step, so as to place in position of loading two new suspended frames. During the forward step-by-step movement, the first loaded suspended frame moves toward the entrance opening 41 of the kiln 2, FIG. 1, in order to start the heating cycle thereof inside the kiln 2.

Immediately after the suspended frame exits the kiln 2 crossing the exit opening 42, the conveyor tape encounters boxes 14, 14b, from C to D, which are separated sections of the vacuum pressure channels 60, 60b, and are connected by means of a tube 17b, 18b with a fan 15b, 16b, FIG. 11, for introducing air between the profiled bar and the transferring sheet through the same connections that, along the path between A and B, enabled the vacuum pressure to be maintained between the transferring sheet and the profiled bar. In this case the fan 15b, 16b introduces air in the boxes 14, 14b, which fan, by means of the same connections as disclosed as regards the bar 11, will blow air within the enclosure, so as to inflate and detach said enclosure from the profiled bar 20. After the profiled bars pass through the exit opening 42 of the kiln 2, other two pairs of operators can begin to unload the profiled bars in the unloading positions 45 and 45b into carriage container or on conveyor belts.

The introduction of air between the transferring sheet and the profiled bar detaches said transferring sheet from the profiled bar so that the profiled bar can be easily released from the exhausted wrapping.

A version of this method can enable a more rapid cooling of the profiled bars and the suction port 12 that need to be handled by the operators.

With reference to FIG. 11, air is introduced by the fan 16b through the tube 18b in the channel 60b of the section 14b, which air will follow backwards the circuits previously used for the vacuum pressure. The air passes into the tube 58b (FIG. 4bis), into the box 40b, into the air-sealed joint 27b and from here into the bar 11. Said bar 11 has been modified so that at its interior there is at least one airtight separating wall, in order to obtain a separation between the two circuits for the vacuum pressure or the admission of air, one for every side of the suspended frame. In this case the introduced air will be introduced into the box section 14 at the opposite side with respect to the box section 14b, so as to be able to exit from the tube 17b, that is no more connected with the fan 16b.

It is apparent that this air flow contributes to cool the suction ports 12, and the profiled bars 21.

In order to regulate in better way this air flow, a pressure regulating valve may be used on the tube 17b, so that the pressure produced by the fan does not break the enclosure wrapped around the profiled bar.

The productivity of the system is very high: considering that each suspended frame carries 16 profiled bars, 8 profiled bars per side, with alternating arrangement, which profiled bars are loaded by the two pairs of operators, eight profiled bars per each pair of operators, with a mean time of 220 sec., a step of advancing movement of the conveyor can be performed every 240 seconds, so that two complete suspended frames are advanced at one time. Whereby, the kiln 2 can decorate 30 suspended frames/hour, with 16 profiled bars for every suspended frame, with a total of 480 profiled bars per hour. In the working time of eight hours the decoration of 3840 profiled bars will be produced.

The present systems operate at the maximal rate of 120 decorated profiled bars per hour, whereby in the eight hours of a working turn, only 960 decorated profiled bar would be produced, whereby the need arises of operating on three working turns in order to obtain a production industrially acceptable of 2880 decorated profiled bars.

The system enables all the personnel normally distributed in the three turns to be advantageously combined in a single turn with great productive and economical advantages. With the technology actually used a production increase during the working time can be obtained only by increasing the number of the installed kilns with a great waste of the spaces taken up by said kilns and the energy.

Actually, a system with kiln, depending on the typology used, is about twelve meters long, five meters wide, three meters high. The system of the invention can be of moderate dimensions, despite the great productivity, indicatively: ten meters long, eight meters wide and four meters high.

The process and the apparatus of the invention, the different single parts of which said invention is composed, herein all disclosed according to a particular, not restrictive embodiment form, comply with all the prefixed objects of reducing the economical costs by means of a great producing capability, by combining the number of the persons in charge of the three normal working turns, being able to produce decorated profiled bars with a continuous cycle. The apparatus can also be realized with constructive geometries or with arrangements of the different single parts with which the apparatus is composed and the overall apparatuses accomplished in a different manner from what exemplificatively disclosed, but all certainly inclusive of the protecting rights deriving from the present patent application.

The invention claimed is:

1. Apparatus for decorating objects by sublimation comprising:
   a kiln for heating said objects;
   a conveyor device having a supporting arrangement for supporting said objects, each object being associated with a transferring sheet having a sublimable decoration;
   a sucking arrangement for sucking air between said transferring sheet and said object
   wherein said supporting arrangement comprises a frame for supporting a plurality of said objects;
   said frame comprising an elongated element extending transversely of an advance direction of said conveyor device and a pair of rods arranged transversely of said elongated element;
   each rod of said pair of rods comprising a plurality of suction ports for sucking air between said transferring sheet and said object, so that a pair of opposite suction ports can be inserted in opposite open ends of an enclosure made from said transferring sheet and wrapping said object;
   said suction ports being staggered along each rod, so that two consecutive suction ports protrude from opposite sides of each rod.

2. Apparatus according to claim 1, wherein at least part of said conveyor device passes through said kiln.

3. Apparatus according to claim 2, wherein said kiln comprises walls extending above said at least part of said conveyor device.

4. Apparatus according to claim 1, wherein said conveyor device comprises a conveying chain arrangement.

5. Apparatus according to claim 4, wherein said frame is rotatably supported by said conveying chain arrangement.

6. Apparatus according to claim 4, wherein said conveying chain arrangement comprises a first conveying chain arranged for moving an end of said frame and a second conveying chain parallel to said first conveying chain and arranged for moving a further end of said frame, said further end being opposite said end.

7. Apparatus according to claim 6, wherein each of said end and of said further end are connected to said first conveying chain and to said second conveying chain by a respective rotating joint.

8. Apparatus according to claim 6, wherein said first conveying chain and said second conveying chain are slidable inside a first track and a second track respectively.

9. Apparatus according to claim 6, wherein said first conveying chain and said second conveying chain are movable with synchronized speeds.

10. Apparatus according to claim 4, wherein said conveying chain arrangement defines a closed loop path for said frame.

11. Apparatus according to claim 1, wherein said frame is arranged transversely to said conveyor device.

12. Apparatus according to claim 1, wherein said elongated element comprises a hollow crossbar traversable by said air.

13. Apparatus according to claim 1, wherein each rod of said pair of rods is suspended to an end region of said elongated element.

14. Apparatus according to claim 13, wherein each rod of said pair of rods is suspended to said end region by means of a hook.

15. Apparatus according to claim 1, wherein each rod of said pair of rods is hollow so that air can be sucked from inside each rod in order to make said enclosure adherent to said object.

16. Apparatus according to claim 1, and further comprising a blowing arrangement provided with at least one blowing channel extending along a further portion of said conveyor device for blowing air between said transferring sheet and said object.

17. Apparatus according to claim 1, wherein said kiln comprises a bell kiln.

18. Apparatus for decorating objects by sublimation comprising:
   a kiln for heating said objects;
   a conveyor device having a supporting arrangement for supporting said objects, each object being associated with a transferring sheet having a sublimable decoration;
   a sucking arrangement for sucking air between said transferring sheet and said object,
   wherein said supporting arrangement comprises a frame for supporting a plurality of said objects;
   said frame comprising an elongated element extending transversely of an advance direction of said conveyor device and a pair of rods arranged transversely of said elongated element;
   said frame further comprising at least one intermediate rod interposed between said rods of said pair of rods, said at least one intermediate rod comprising a plurality of supporting members for supporting said objects in an intermediate portion thereof.

19. Apparatus according to claim 18, wherein said supporting members are staggered along each rod, so that two consecutive supporting members protrude from opposite sides of each intermediate rod.

20. Apparatus for decorating objects by sublimation comprising:
   a kiln for heating said objects;
   a conveyor device having a supporting arrangement for supporting said objects, each object being associated with a transferring sheet having a sublimable decoration;
   a sucking arrangement for sucking air between said transferring sheet and said object,
   wherein said supporting arrangement comprises a frame for supporting a plurality of said objects;
   said sucking arrangement comprising at least one sucking channel extending along, and parallel to, a portion of said conveyor device.

21. Apparatus according to claim 20, wherein said at least one sucking channel comprises a U-shaped stationary portion, said U-shaped stationary portion being closed by a belt-shaped closing element.

22. Apparatus according to claim 21, wherein said belt-shaped closing element is slidable between a pair of guides fixed to said U-shaped stationary portion.

23. Apparatus according to claim 21, and further comprising an adjustment device for tensioning said belt-shaped closing element, said adjustment device having a first part fixed to said conveyor device and a second part engaged with said belt-shaped closing element by means of a resilient member.

24. Apparatus according to claim 20, wherein said sucking arrangement further comprises a connecting device for creating a fluid communication between said frame and said at least one sucking channel.

25. Apparatus according to claim 24, wherein said connecting device comprises a pipe connecting said at least one sucking channel to an air path obtained inside said frame.

* * * * *